(12) United States Patent
Gyoda

(10) Patent No.: US 8,450,914 B2
(45) Date of Patent: May 28, 2013

(54) ELECTRO-OPTICAL DEVICE INCLUDING A HEAT RELEASE MEMBER

(75) Inventor: Kozo Gyoda, Chino (JP)

(73) Assignee: Seiko Epson Corporation, Tokyo (JP)

( * ) Notice: Subject to any disclaimer, the term of this patent is extended or adjusted under 35 U.S.C. 154(b) by 212 days.

(21) Appl. No.: 12/972,925

(22) Filed: Dec. 20, 2010

(65) Prior Publication Data

US 2011/0169393 A1  Jul. 14, 2011

(30) Foreign Application Priority Data

Jan. 12, 2010 (JP) ................. 2010-003685

(51) Int. Cl.
*H01J 7/24* (2006.01)
(52) U.S. Cl.
USPC ............................................. 313/45; 445/25
(58) Field of Classification Search
CPC ..................................... H01J 7/24; H01L 37/12
USPC ........................................... 313/45; 362/239
See application file for complete search history.

(56) References Cited

U.S. PATENT DOCUMENTS

| | | | |
|---|---|---|---|
| 7,705,536 B2 * | 4/2010 | Yanagawa et al. | 313/582 |
| 7,848,091 B2 * | 12/2010 | Han et al. | 361/679.26 |
| 2007/0146307 A1 * | 6/2007 | Kuo et al. | 345/107 |
| 2007/0195009 A1 * | 8/2007 | Yamamoto et al. | 345/1.1 |
| 2008/0013265 A1 * | 1/2008 | Kim | 361/681 |

* cited by examiner

*Primary Examiner* — Tracie Y Green
(74) *Attorney, Agent, or Firm* — Oliff & Berridge, PLC

(57) ABSTRACT

An electro-optical device includes: a supporting unit that includes a first heat release member; a second heat release member that is provided at both of two sides with respect to the supporting unit, at least a part of the second heat release member being in contact with the first heat release member; an electro-optical panel that is provided at both of the two sides with respect to the supporting unit in such a manner that at least a part of a surface of the electro-optical panel opposite to a surface thereof from which light is emitted is in contact with a surface of the second heat release member; and a transparent film sheet that covers the surface of the electro-optical panel from which light is emitted.

6 Claims, 7 Drawing Sheets

ELECTRO-OPTICAL DEVICE INCLUDING A HEAT RELEASE MEMBER

BACKGROUND

1. Technical Field

The present invention relates to an electro-optical device.

2. Related Art

The use of an electro-optical device for, for example, a mobile phone, a personal computer, and an in-vehicle monitor is growing rapidly. The electro-optical device displays an image by using its electro-optical panel. In the electro-optical panel, electro-optical elements are arranged in a two-dimensional pattern over a substrate that is made of glass or the like. Recently, as disclosed in JP-A-2003-337322, an electro-optical device that has both resistance to mechanical shock or the like and flexibility has been proposed in the art. In the disclosed art, the thickness of a glass substrate is reduced to approximately 20 to 100 μm. The thinned substrate is sandwiched between film sheets for mechanical strength and flexibility.

However, in a structure in which an electro-optical panel includes self-luminous electro-optical elements, it is difficult to efficiently release heat generated at the time of light-emitting operation from the electro-optical panel sandwiched between film sheets as in the above art. For this reason, there is a problem in that the light-emitting characteristics of the electro-optical elements change because of the effects of heat. If a radiator plate that is made of metal such as Al is provided on the reverse face of the electro-optical panel in order to provide a solution to the above problem, the flexibility of the panel is sacrificed. Because of the lack of flexibility, there is a problem in that such a technique cannot be applied to an "en face" electro-optical device such as an electronic book.

SUMMARY

To provide a solution to at least a part of the above problems without any limitation thereto, the invention provides, as various aspects thereof, an electro-optical device including the constituent elements and having the features stated in Application Examples below, specific examples of which are described in detail in DESCRIPTION OF EXEMPLARY EMBODIMENTS.

Application Example 1

An electro-optical device according to a first aspect of the invention includes: a supporting unit that includes a first heat release member; a second heat release member that is provided at both of two sides with respect to the supporting unit, at least a part of the second heat release member being in contact with the first heat release member; an electro-optical panel that is provided at both of the two sides with respect to the supporting unit in such a manner that at least a part of a surface of the electro-optical panel opposite to a surface thereof from which light is emitted is in contact with a surface of the second heat release member; and a transparent film sheet that covers the surface of the electro-optical panel from which light is emitted.

With such a structure, it is possible to transfer heat generated due to the emission of light from the electro-optical panel via the second heat release member to the first heat release member and to dissipate the heat from the first heat release member. A user can open and close the electro-optical panel provided at both of the two sides with respect to the supporting unit. The first heat release member of the supporting unit, which is provided therebetween, can function as a spine. Therefore, it is possible to provide an en face electro-optical device that can be used continuously.

Application Example 2

In an electro-optical device according to the first aspect of the invention, it is preferable that the supporting unit should further include a circuit section for controlling the electro-optical panel and a battery for driving the electro-optical panel; and the electro-optical panel should be connected to the circuit section via an FPC.

With such a preferred structure, it is possible to provide a portable en face electro-optical device that can be used continuously.

Application Example 3

In an electro-optical device according to the first aspect of the invention, it is preferable that the second heat release member should be a graphite sheet.

The thermal conductivity of a graphite sheet in a planar direction is higher than that in a layer-thickness direction. Therefore, with such a preferred structure, it is possible to transfer heat generated at the electro-optical panel to the first heat release member efficiently. Thus, it is possible to provide an en face electro-optical device with greater reliability for continuous use.

Application Example 4

In an electro-optical device according to the first aspect of the invention, it is preferable that a surface of the second heat release member opposite to the surface thereof that is in contact with the electro-optical panel should be covered with the film sheet.

With such a preferred structure, it is possible to protect the second heat release member without obstructing heat dissipation from the first heat release member. Therefore, it is possible to provide an en face electro-optical device that can be used continuously and, in addition, offers enhanced durability.

Application Example 5

In an electro-optical device according to the first aspect of the invention, it is preferable that, at either one of the two sides, or at both of the two sides, the electro-optical panel is provided on each of a front face and a reverse face of the second heat release member, the front face or the reverse face being the surface mentioned therein.

With such a preferred structure, it is possible to provide an en face electro-optical device that has three or more panel screens for display.

Application Example 6

In an electro-optical device according to the first aspect of the invention, it is preferable that the self-luminous element should be an organic EL element.

With such a preferred structure, it is possible to continuously use an organic EL element whose characteristics change significantly due to heat. Thus, it is possible to provide an en face electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENTS

With reference to the accompanying drawings, a method for manufacturing an electro-optical device according to exemplary embodiments of the invention will now be explained. In the present embodiment of the invention, an organic EL device that is provided with an organic EL panel is taken as an example of an electro-optical device. The organic EL panel is an example of an electro-optical panel. In the accompanying drawings that will be referred to in the following description, each of layers, parts, members, and the like that are illustrated therein is scaled up or down for easier recognition.

First Embodiment

Figure 1:
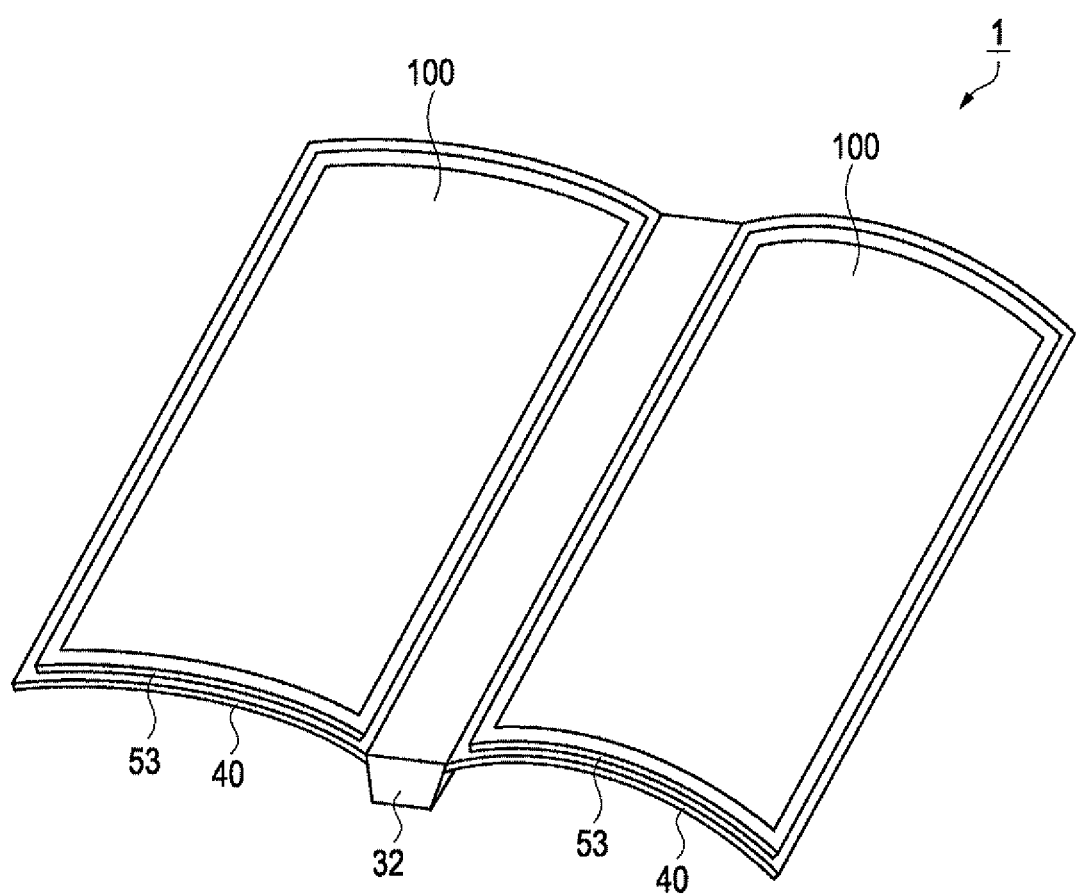
FIG. 1 is a perspective view that schematically illustrates an example of the appearance of an organic EL device according to a first embodiment of the invention.
Figure 2:
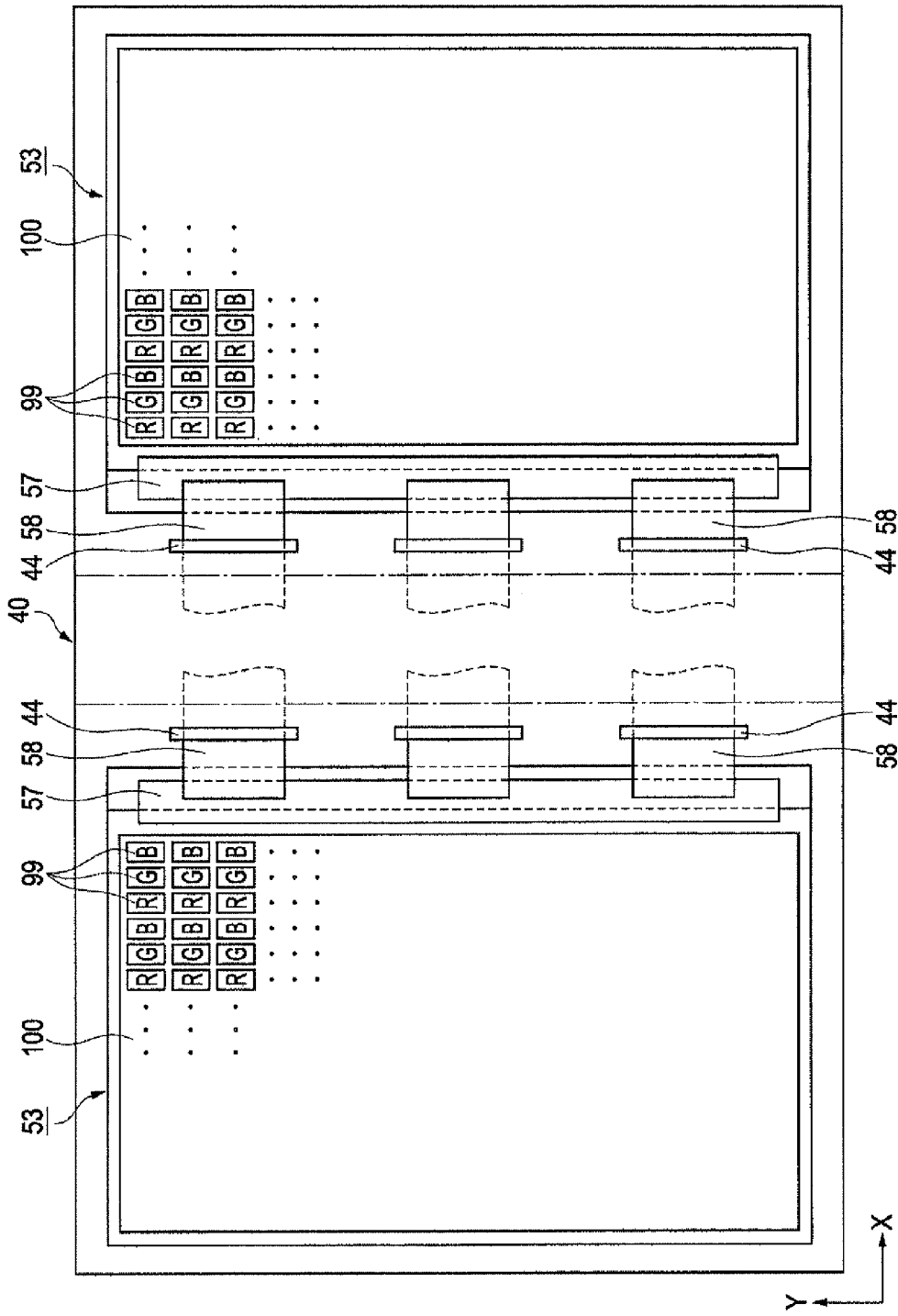
FIG. 2 is a plan view that schematically illustrates a graphite sheet and an organic EL panel, both of which are components of the organic EL device according to the first embodiment of the invention.
Figure 3:
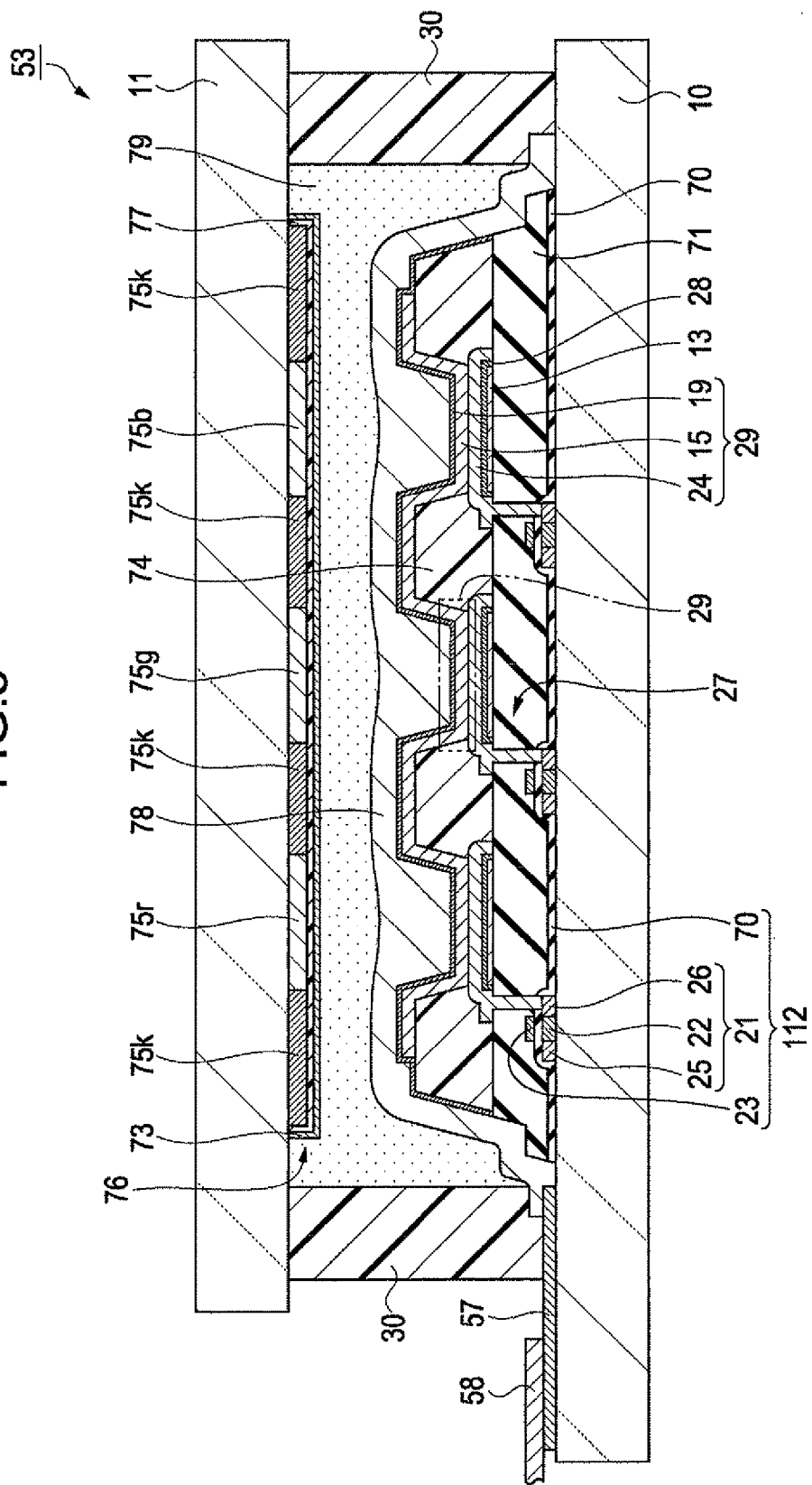
FIG. 3 is a sectional view that schematically illustrates an example of the structure of the organic EL panel according to the first embodiment of the invention.
Figure 4:
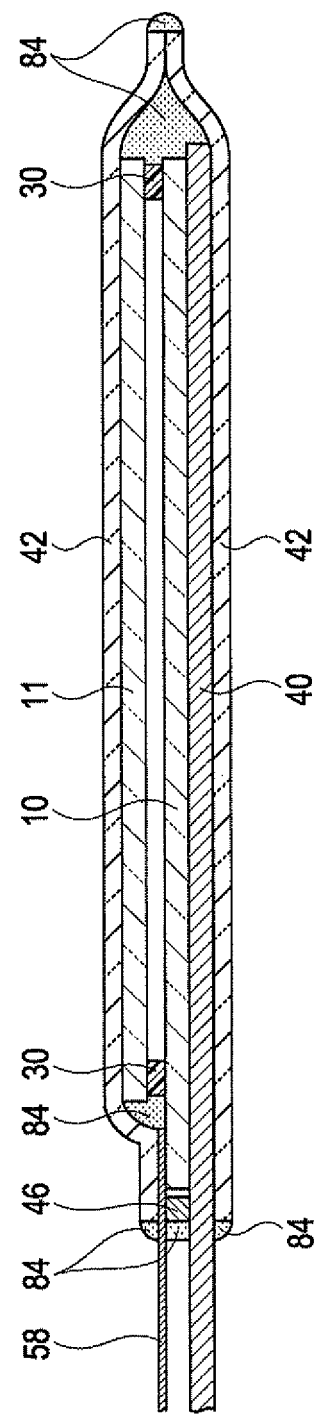
FIG. 4 is a sectional view that schematically illustrates an example of the structure of a laminated body that is made up of the graphite sheet and the organic EL panel according to the first embodiment of the invention.
Figure 5:
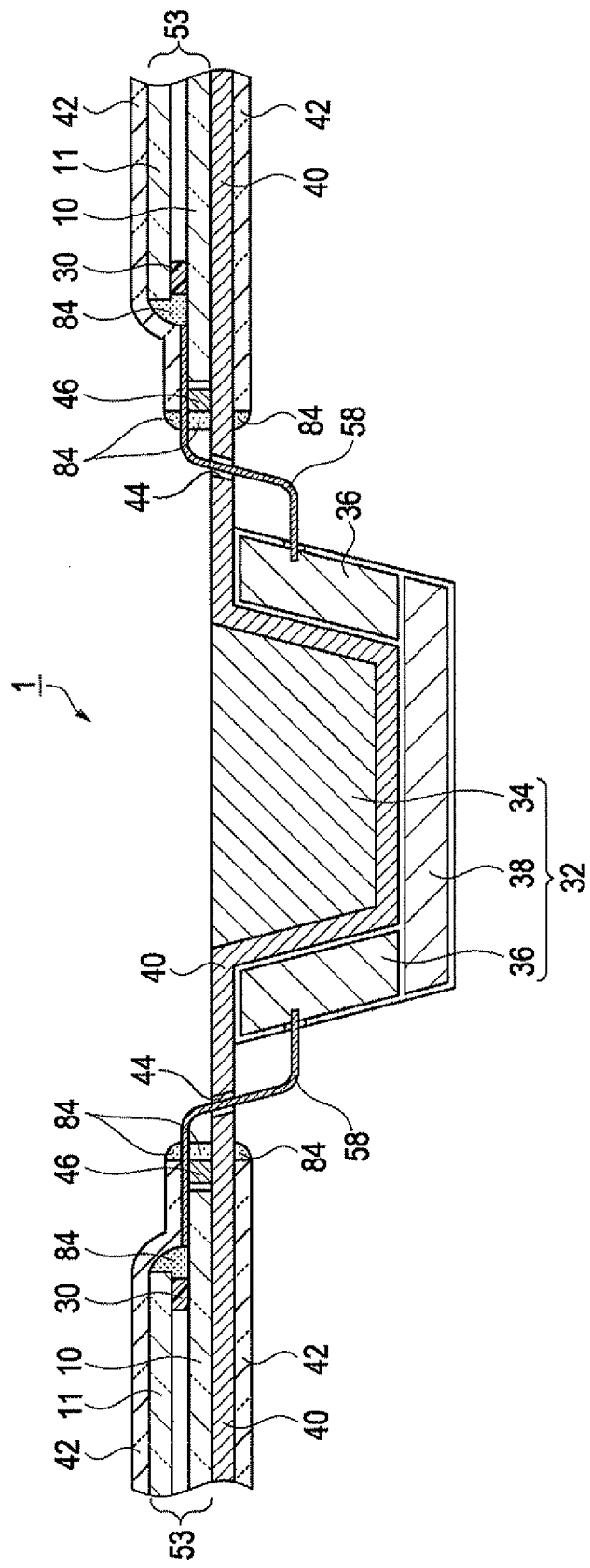
FIG. 5 is a sectional view that schematically illustrates an example of the structure of the organic EL device according to the first embodiment of the invention.

With reference to FIGS. 1 to 5, an organic EL device 1 according to the present embodiment of the invention will now be explained. FIG. 1 is a perspective view that schematically illustrates an example of the appearance of the organic EL device 1. FIG. 2 is a plan view that schematically illustrates a graphite sheet 40 and an organic EL panel 53, both of which are components of the organic EL device 1. The graphite sheet 40 is an example of a second heat release member. The organic EL panel 53 is laminated on the graphite sheet 40. FIG. 3 is a sectional view that schematically illustrates an example of the structure of the organic EL panel 53. FIG. 4 is a sectional view that schematically illustrates an example of the structure of a laminated body that is made up of the graphite sheet 40 and the organic EL panel 53. FIG. 5 is a sectional view that schematically illustrates an example of the structure of the organic EL device 1.

As illustrated in FIG. 1, the organic EL device 1 according to the present embodiment of the invention includes a supporting unit 32, the graphite sheet 40 functioning as the second heat release member, and the organic EL panel 53. A part of the graphite sheet 40 is embedded inside the supporting unit 32. The organic EL panel 53 is laminated on one surface of the graphite sheet 40. The organic EL panel 53 has a left part and a right part each of which is provided next to the supporting unit 32 (hereinafter may be referred to as "two organic EL panel modules (panels)" or collectively as "organic EL panel"). That is, the supporting unit 32 is provided between the two organic EL panel modules 53.

The organic EL panel 53 has a plurality of organic EL elements 29 (refer to FIG. 3). The organic EL elements 29 are arranged, inside each of two display areas 100 of the organic EL panel 53 in regular array. The organic EL elements 29 function as plural self-luminous (light-emitting) elements. A circuit unit 36 (refer to FIG. 5) for driving the above organic EL elements 29 as will be explained later is built in the supporting unit 32. The circuit unit 36 controls, for example, the intensity of light emitted from each individual organic EL element 29 to display characters, an image, or the like inside the display area 100.

The supporting unit 32 is a member that has rigidity. Excluding a laminated body that is made up of the organic EL panel 53 and the graphite sheet 40, protection sheets (explained later) for covering the laminated body, and the like, no member is provided on each of the two sides with respect to the supporting unit 32. Since each of a pair of substrates between which the organic EL elements 29 and the like are sandwiched is thin, the organic EL panel 53 has flexibility. Since the organic EL device 1 has such a structure, a user can use the organic EL panel 53 at both sides like pages with the supporting unit 32 functioning as a spine. That is, the user can use the organic EL device 1 as an "en face" display device.

Being provided with the graphite sheet 40, the organic EL device 1 can efficiently release heat generated when the organic EL elements 29 are driven. Generally, a graphite sheet is an ultra-thin sheet that is made of black lead. A graphite sheet has low thermal conductivity in a vertical direction (which is the direction perpendicular to the face of the sheet). The thermal conductivity of a graphite sheet in a horizontal direction is higher than that of metal such as Al (aluminum). Since a graphite sheet is an ultra-thin sheet made of black lead, it has flexibility unlike a radiator plate that is made of Al or the like. Heat generated when the organic EL panel 53 displays an image or the like is transferred to the supporting unit 32. Then, the heat is released from the supporting unit 32. By this means, the organic EL device 1 can release heat without sacrificing the flexibility of the organic EL panel 53.

FIG. 2 is a plan view that schematically illustrates a laminated body that is made up of the graphite sheet 40, which is an example of the second heat release member, and the organic EL panel 53 of the organic EL device 1. The center area of the graphite sheet 40 that is shown by a pair of alternate long and short dash lines each of which goes in the Y direction is a part that is embedded inside the supporting unit 32 (refer to FIG. 1) when assembled. The center area of the graphite sheet 40 is located between areas of the organic EL panel 53. Slits 44 each of which is elongated in the Y direction are formed between the center area of the graphite sheet 40 and the areas of the organic EL panel 53.

The display areas 100 are formed on the front face of the organic EL panel 53, that is, on one surface opposite to the other surface that is in contact with the graphite sheet 40. A terminal portion 57 is formed at the slit (44) side of the display area 100. An FPC 58 is connected to the terminal portion 57. Since the FPC 58 is inserted through the slit 44, electrical conduction through the slit 44 to a reverse-face side of the graphite sheet 40 (i.e., one surface opposite to the other surface that is in contact with the organic EL panel 53) can be established.

A plurality of pixel areas 99 is formed inside the display area 100 of the organic EL panel 53 in regular array. Each of the plurality of pixel areas 99 corresponds to one of the plurality of organic EL elements 29. That is, there is one-to-one correspondence therebetween. An area of the organic EL element 29 where light is emitted constitutes the pixel area 99. Therefore, the pixel area 99 can be conceptualized in two dimensions as a unit area where light having, for example, a uniform color is emitted. An alphabet shown in each of the plurality of pixel areas 99 denotes the color of light emitted thereat. Specifically, red light is emitted from each of the pixel areas 99 denoted as R. Green light is emitted from each of the pixel areas 99 denoted as G. Blue light is emitted from each of the pixel areas 99 denoted as B.

Though not illustrated in the drawings, an external driving circuit is provided outside the display area 100 in a plan view. The external driving circuit drives each of the plurality of organic EL elements 29. The external driving circuit is connected to the terminal portion 57. One end of the FPC 58 is connected to the terminal portion 57, whereas the other end of the FPC 58 is connected to the circuit unit 36, which is built in the supporting unit 32. Therefore, the external driving circuit, which is connected to the terminal portion 57, is indirectly connected to the circuit unit 36 by means of the FPC 58, which is inserted through the slit 44.

FIG. 3 is a sectional view that schematically illustrates an example of the structure of the organic EL panel 53. As illustrated therein, the organic EL panel 53 is made up of an element substrate 10, a counter substrate 11, and various elements that are formed or provided between the pair of substrates 10 and 11. More specifically, the element substrate 10, over which the plurality of organic EL elements 29 functioning as self-luminous elements is formed, is bonded to the counter substrate 11, on which a color filter layer 76 is formed, with the use of an adhesive. A sealing member 30 and a layer 79 of the adhesive are provided between the element substrate 10 and the counter substrate 11 (that are positioned opposite to each other). In the following description, the adhesive-layer (79) side of the element substrate 10 is defined as the topside thereof. The terms "upper", "over", "above", or "upward" may be used herein on the basis of such definition.

A driving TFT (hereinafter simply referred to as "TFT") 112 and the terminal portion 57 are formed over the element substrate 10. The TFT 112 is made up of a semiconductor layer 21, a gate electrode 23, which is formed by patterning a conductive layer that is made of, for example, titanium (Ti) or aluminum-copper alloy (AlCu), and a gate insulation layer 70, which is formed between the semiconductor layer 21 and the gate electrode 23. A channel region 22 is an area of the semiconductor layer 21 that lies at the area of the gate electrode 23 in a plan view. The channel region 22 is formed between a source region 25 and a drain region 26. Besides the TFT 112, a switching TFT (not shown) and a hold capacitor (not shown) are provided for each of the plurality of organic EL elements 29 over the element substrate 10. Theses TFTs and the like are connected to the FPC 58 through the terminal portion 57.

An interlayer insulation layer (i.e., inter-bedded insulation layer) 71 is formed on the TFT 112. The interlayer insulation layer 71 has a laminated structure made up of an inorganic insulation material such as silicon nitride or silicon oxide and an organic insulation material such as acrylic resin. The interlayer insulation layer 71 is locally etched away to form a contact hole 27 therethrough. A pixel electrode 24 is electrically connected to the drain region 26 of the TFT 112 via the contact hole 27. It is necessary for the material of the pixel electrode 24 to have a work function that is greater than that of a negative electrode 19. In addition, the material of the pixel electrode 24 must be conductive. Therefore, ITO (indium oxide tin alloy), which is a kind of a transparent conductive material, is used as the material of the pixel electrode 24.

A reflection layer 13 and a protection layer 28 are formed under the pixel electrode 24. The reflection layer 13 reflects light emitted from a light-emitting function layer 15, which will be explained later, toward the element substrate 10 upward. The reflection layer 13 is covered with the protection layer 28. It is preferable that the reflection layer 13 should be made of a material that has high reflectivity. In addition, preferably, the material of the reflection layer 13 should have excellent patterning property. Therefore, the reflection layer 13 of the organic EL panel 53 is made of, for example, Al. The protection layer 28 is made of a material that is resistant to ITO etchant (selectivity) such as silicon nitride.

The pixel electrode 24 is formed for each of the plurality of TFTs 112. Therefore, the pixel electrode 24 is patterned as a plurality of island electrodes isolated from one another. These adjacent pixel electrodes are electrically independent of one another. A partition wall 74 is formed at each area where the pixel electrode 24 is not formed in a plan view. The partition wall 74, which is formed by patterning a layer made of an insulation material such as acrylic resin, ensures insulation between the two pixel electrodes 24 between which this partition wall 74 is formed.

The light-emitting function layer 15 is formed on the plurality of pixel electrodes 24 and the plurality of partition walls 74 over the entire upper surface of the element substrate 10. As will be explained later, in the structure of the organic EL panel 53, a color filter is used to output light of the three primary colors. Therefore, the light-emitting function layer 15 is a white-light-emitting function layer, which emits white light when a current is applied. Note that the light-emitting function layer 15 is a collective name for four layers. Specifically, the light-emitting function layer 15 has a laminated structure that is made up of a hole injection layer, a hole transport layer, an organic EL layer, and an electron transport layer. These layers are formed in this order as viewed from the element substrate 10, that is, with the hole injection layer being the lowest layer thereof. The hole injection layer is a layer that makes it easier to inject holes. The hole transport layer is a layer that makes it easier to transport the injected holes to the light-emitting layer. An electron injection layer is a layer that makes it easier to inject electrons.

The organic EL layer is a layer that emits light as a result of excitation caused by the re-coupling of holes and electrons injected by an electric field. A low-molecular organic EL material or a high-molecular organic EL material is used as the material of the organic EL layer. Among organic compounds that emit light as a result of excitation caused by the re-coupling of holes and electrons, a low-molecular organic EL material is a type that has a relatively low molecular weight. Among organic compounds that emit light as a result of excitation caused by the re-coupling of holes and electrons, a high-molecular organic EL material is a type that has a relatively high molecular weight.

The negative electrode 19, which functions as a common electrode, is formed on the entire upper surface of the light-emitting function layer 15. Since the organic EL panel 53 is a top-emission panel, it is required that the negative electrode 19 should have both electric conductivity and transparency (translucency). To ensure good electron-injection property, it is preferable that a layer of a material that has a work function that is less than that of the material of the pixel electrode 24 should be formed as an electron injection layer at the interface between the light-emitting function layer 15 and the negative electrode 19. For this reason, in the organic EL panel 53, a layer of Al with a thickness of 2 nm and a layer of LiF (lithium fluoride) with a thickness of 1 nm are formed as the electron injection layer, followed by the laminating of ITO on the electron injection layer so as to form the negative electrode 19. Such a structure offers transparency and electron-injection property. A low-resistance layer that is made of, for example, Al may be formed as an auxiliary electrode over the partition walls 74, thereby reducing the surface resistance of the negative electrode 19.

The organic EL element 29 is a laminated body that is made up of the negative electrode 19, the light-emitting function layer 15, and the pixel electrode 24. When a voltage is applied to the pixel electrode 24 via the TFT 112, a current flows through the light-emitting function layer 15 between the pixel electrode 24 and the negative electrode 19. As a result, the organic EL layer of the light-emitting function layer 15 emits light, the amount of which depends on amount of the current.

A sealing layer 78 is formed over the plurality of partition walls 74 and the plurality of organic EL elements 29 arranged over the element substrate 10 in regular array. Although the sealing layer 78 is illustrated in the FIG. 3 as if it were a single layer, it is actually a laminated body that includes at least the following three layers: a negative electrode protection layer, an organic shock absorption layer, and a gas barrier layer. These layers are formed in this order as viewed from the negative electrode 19, that is, with the negative electrode protection layer being the lowest layer thereof.

The negative electrode protection layer is made of an inorganic material. For example, it is made of a silicide such as silicon oxynitride (SiON). The organic shock absorption layer is a filling layer formed for smoothening undulation formed by the plurality of partition walls 74 and openings where the partition walls 74 are not formed. As its name indicates, the organic shock absorption layer has a function of absorbing mechanical shock. Resin that has high transparency and low moisture permeability, for example, an epoxy compound, can be used as the material of the organic shock absorption layer. The gas barrier layer is made of an inorganic material. In particular, in consideration of translucency, gas barrier property, and water-resisting property, for example, silicon oxynitride is used as the material of the gas barrier layer.

The color filter layer 76 is provided on the element-substrate-side (10) surface of the counter substrate 11. The color filter layer 76 includes color filters 75 (r, g, b), a black matrix 75k, an overcoat layer 77, and an inorganic gas barrier layer 73. The color filter 75 is formed at each area where it faces the organic EL element 29. The black matrix 75k, which is made of a light-shielding material, is formed at each area between the color filters 75. The overcoat layer 77 is covered with the inorganic gas barrier layer 73.

The black matrix 75k is formed by patterning, for example, Cr (chromium) by using a photolithographic method. The overcoat layer 77 is made of a resin material such as, for example, acryl or polyimide. The inorganic gas barrier layer 73 is made of an inorganic material. For example, it is made of a silicide such as silicon oxynitride (SiON).

A photolithographic method or a liquid droplet discharging method is used for forming the color filters 75 (r, g, b). In the photolithographic method, a photosensitive resin material that contains colorants is applied to the surface, followed by light exposure and development, thereby forming the color filters 75 (r, g, b). In the liquid droplet discharging method, liquid that contains colorants is discharged onto each film-forming area that is demarcated by partition walls. The discharged liquid is then dried to form the color filters 75 (r, g, b). The color filter 75 allows light within a predetermined wavelength range to pass therethrough and absorbs light outside the predetermined wavelength range. By this means, it is possible to generate colored light from white light. The lowercase alphabet (r, g, b) denotes the color of light within the predetermined wavelength range, which is allowed to pass through the color filter 75.

The structure of the organic EL element 29 is the same irrespective of the output color of light. It is the color filter 75 (r, g, b) that determines the output color of light by coloring white light emitted from the organic EL element 29. Since a component of light emitted from each of the plurality of organic EL elements 29 is selectively allowed to pass through the color filter layer 76 depending on the wavelength range, light of any of the three primary colors is outputted for each of the plurality of organic EL elements 29 at an arbitrary level of intensity. In this way, a color image is formed (i.e., displayed) on the display area 100 (refer to FIG. 1) at the counter-substrate-side (11) surface.

The display area 100 is a substantially rectangular area. The plurality of organic EL elements 29 is arranged inside the display area 100 in regular array. The sealing member 30 encloses the plurality of organic EL elements 29 arranged in regular array in a plan view. A resin material is filled inside the area enclosed by the sealing member 30 to form into the adhesive layer 79. Low-elasticity resin that contains, for example, urethane resin or acrylic resin to which isocyanate is added as a hardener can be used as the material of the adhesive layer 79.

The sealing member 30 is formed as follows. A layer of sealant, which has not hardened yet, is formed on the element substrate 10 by using a printing method or the like. The counter substrate 11 is positioned opposite to the element substrate 10. The layer of sealant hardens subsequently and turns into the sealing member 30. For example, a material that contains a base material that has low moisture permeability such as epoxy resin, acid anhydride added to the base material as a hardener, and silane coupling agent added to the base material as an accelerator can be used as the sealant. The thickness of the sealing member 30 is approximately 15 μm. In other words, the aggregate thickness of the color filter layer 76, the organic EL element 29, the adhesive layer 79, and the like does not exceed the above thickness, approximately 15 μm.

Each of the pair of substrates of the organic EL panel 53, that is, the element substrate 10 and the counter substrate 11, is made of a glass material. Each of the pair of substrates of the organic EL panel 53 has a thickness of 20 to 100 μm. Preferably, its thickness should be approximately 30 μm. An original glass substrate has a thickness of approximately 500 μm. After the forming of the plurality of organic EL elements 29 and the like as described above, original glass substrates are bonded to each other with the sealing member 30 being provided therebetween. Then, either an etching method or a CMP (chemical mechanical polishing) method is used to reduce the thickness thereof.

Since the thickness of the sealing member 30 is approximately 15 μm as described above, the thickness of the organic EL panel 53 should be approximately 75 μm. Since each of the element substrate 10 and the counter substrate 11 has such a thin structure obtained by reducing the thickness of the original glass substrate to the above value, the organic EL panel 53 is flexible.

FIG. 4 is a sectional view that schematically illustrates an example of one of two parts each of which is provided next to the supporting unit 32 (with the supporting unit 32 being provided between the two parts, refer to FIG. 1), that is, a laminated body that is made up of the graphite sheet 40 and the organic EL panel 53. As illustrated in FIG. 4 and explained above, the organic EL panel 53 includes a pair of substrates, that is, the element substrate 10 and the counter substrate 11 that are bonded to each other with the sealing member 30 being provided therebetween. The element substrate 10 of the organic EL panel 53 is bonded to the graphite sheet 40. Each of two surfaces of the laminated body made up of the graphite sheet 40 and the organic EL panel 53 is covered with a film sheet 42. Since no radiator plate that is made of metal such as Al is provided thereat, the part illustrated in FIG. 4 is completely flexible.

The film sheet 42 is made up of a base material film that has transparency and an adhesive layer that also has transparency. Excluding a part of the graphite sheet 40 that extends at the FPC (58) side, the film sheets 42 cover the laminated body. In order to prevent the infiltration of moisture, gas, or the like from the outside, it is preferable to use a transparent resin film that has low gas permeability as the base material film. For example, a film made of resin such as polyester such as polyethylene terephthalate (PET) or polyethylene naphthalate (PEN), polyethersulfone (PES), polycarbonate (PC), polyethylene (PE), or the like can be used as such a resin film. As the material of the adhesive layer, for example, a thermoplastic epoxy resin adhesive can be used. Alternatively, it may be a gluing agent that has glutinosity.

Since each of the graphite sheet 40 and the organic EL panel 53 has an end face, the laminated body made up of the graphite sheet 40 and the organic EL panel 53 has a level difference at its end region. It is difficult to cover such a level-difference portion completely by using the film sheet 42 only. For this reason, sealing resin 84 or the like is filled at the level-difference portion. In like manner, the sealing resin 84 is used to seal the junction of the two film sheets 42. In addition, a spacer 46 is provided between the FPC 58 and the graphite sheet 40. The spacer 46 prevents the FPC 58 from being bent to develop a crack when covering the above laminated body with the film sheets 42.

FIG. 5 is a sectional view that schematically illustrates an example of the structure of the organic EL device 1 taken along a plane perpendicular to the direction of the length of the supporting unit 32. Note that the two organic EL panel modules 53 provided at respective sides are partially shown in FIG. 5. As illustrated therein, the supporting unit 32 includes a heat release bar 34 and an embedded part of the graphite sheet 40. The heat release bar 34, which is elongated in the direction of the length of the supporting unit 32, is an example of a first heat release member. One face of the heat release bar 34 is exposed to the outside. The embedded part of the graphite sheet 40 is in direct contact with the other faces of the heat release bar 34. The circuit unit 36, which is used for controlling the organic EL panel 53, and a battery 38, which is used for driving the organic EL panel 53, are provided on one surface of the graphite sheet 40 opposite to the other surface that is in contact with the heat release bar 34. The shape of the supporting unit 32 is not limited to a bar. It may be modified as long as the supporting unit 32 can support the organic EL panel (panel modules) 53 at both sides with the supporting unit 32 being provided therebetween and, in addition, can house or hold the circuit unit 36. In such a modified structure in which the shape of the supporting unit 32 is not a bar, the first heat release member is not limited to a bar-shaped member (i.e., the heat release bar 34).

The heat release bar 34 is made of metal that has high thermal conductivity such as Al. Therefore, the heat release bar 34 can dissipate heat transferred from the graphite sheet 40 to the outside, that is, into the air efficiently. As explained earlier, the graphite sheet 40 has high thermal conductivity in the horizontal direction and low thermal conductivity in the vertical direction. Because of the above characteristics of the graphite sheet 40, despite the fact that each of the two surfaces of the laminated body is covered with the film sheet 42, it is possible to transfer heat generated when the organic EL elements 29 are driven to the heat release bar 34 efficiently for dissipation from the heat release bar 34 into the air.

As explained earlier, the light-emitting characteristics of the organic EL element 29 change due to heat. For this reason, it is difficult to drive it in a stable manner for a long time unless heat generated at the time of light emission is released in one way or another. In the structure of the organic EL device 1, the graphite sheet 40 is provided on the surface opposite to the display-area (100, refer to FIG. 1) surface. Heat can be dissipated from the heat release bar 34, which is provided between the two organic EL panel modules 53, instead of dissipating heat in the direction perpendicular to the surface of the element substrate 10 at the display areas 100. Therefore, the organic EL device 1 can display an image or the like in a stable manner for a long time without opening the reverse face (the surface of the element substrate 10) of the organic EL panel 53 and, in addition, without any need to provide a radiator plate that is made of metal.

As explained earlier, the organic EL panel 53 has a thin structure with a thickness of approximately 75 μm. Because of such a thin structure, the organic EL panel 53 is flexible. Therefore, it is preferable to reinforce the organic EL panel 53 in one way or another, for example, by providing a reinforcing sheet so as to enhance durability. In a structure in which, for example, a radiator plate that is made of metal is provided on the back of the organic EL panel 53, flexibility has to be sacrificed though the structure has a sufficient mechanical strength. In a structure in which the front face of the organic EL panel 53 and the reverse face thereof are covered with the film sheets 42 directly, heat release is not sufficient though the structure is flexible. Because of poor heat release, it will be difficult to display an image or the like in a stable manner for a long time.

In the structure of the organic EL device 1 according to the present embodiment of the invention, one surface of the organic EL panel 53 is covered with the film sheet 42 directly whereas the other surface of the organic EL panel 53 is covered with the film sheet 42 indirectly with the graphite sheet 40 being sandwiched between the organic EL panel 53 and the film sheet 42, The graphite sheet 40 has high thermal conductivity in the horizontal direction, that is, in the planar direction. Having such a structure, the organic EL device 1 offers enhanced durability without sacrificing heat-releasing property and flexibility. In the structure of the organic EL device 1 according to the present embodiment of the invention, the heat release bar 34, which is elongated, is used as a member that dissipates heat transferred from the graphite sheet 40. The heat release bar 34 is provided as a component of the supporting unit 32. Because of such a structure, a user can use the flexible organic EL panel 53, which is, in the present embodiment, two organic EL panel modules provided at respective sides with respect to the supporting unit 32, that is, with the supporting unit 32 being provided therebetween, like pages in a two-page spread (i.e., en face) view with the supporting unit 32 functioning as a spine.

The FPC 58, which is connected to the terminal portion 57 (refer to FIGS. 2 and 3) of the organic EL panel 53 at its one end, is connected through the slit 44, which is formed through the graphite sheet 40, to the circuit unit 36 at its other end. When the organic EL panel 53 is operated, the plurality of organic EL elements 29 (refer to FIG. 3) is driven individually on the basis of image information that is supplied from the circuit unit 36 so as to display an image on the display area 100. The built-in battery 38 supplies power that is necessary for driving. Thus, the organic EL device 1 can be used as a portable en face display device that does not require a power code or the like, for example, as an electronic book.

Second Embodiment

Next, a second embodiment of the invention will now be explained. An organic EL device 2 according to the present embodiment of the invention is similar to the organic EL device 1 according to the first embodiment of the invention in terms of structure and the like. A laminated body that is made up of the graphite sheet 40 and the organic EL panel 53 is provided at each of two sides with respect to the supporting unit 32. The organic EL device 2 can be used as an en face e-book. The structure of the organic EL panel 53 according to the present embodiment of the invention is also substantially the same as that of the first embodiment of the invention. As another point of agreement, the slit 44 through which the FPC 58 is inserted is formed through the graphite sheet 40. Therefore, the present embodiment of the invention is explained with reference to drawings that correspond to FIGS. 4 and 5 only. No drawing corresponding to FIGS. 1, 2, and 3 is attached hereto. In the following description of the organic EL device 2 according to the second embodiment of the invention, the same reference numerals are consistently used for the same components as those of the organic EL device 1 according to the first embodiment of the invention to avoid redundant explanation.

Figure 6:
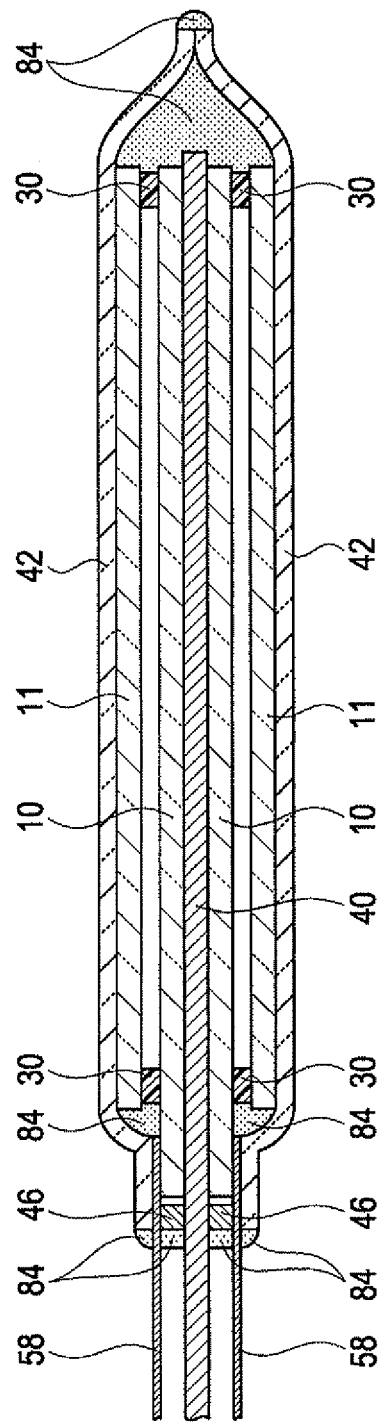
FIG. 6 is a sectional view that schematically illustrates an example of the structure of a laminated body that is made up of a graphite sheet and an organic EL panel according to a second embodiment of the invention.

FIG. 6 is a sectional view that schematically illustrates an example of the structure of a laminated body that is made up of the graphite sheet 40 and the organic EL panel 53 of the organic EL device 2. FIG. 6 corresponds to FIG. 4. The organic EL device 2 is characterized in that the graphite sheet 40 is sandwiched between two organic EL panel modules 53. In other words, an organic EL panel module 53 is provided on each of the two surfaces of the graphite sheet 40. The element-substrate (10) surface of one of the two organic EL panel modules 53 faces toward the element-substrate (10) surface of the other. As in the structure of the organic EL device 1, the laminated body made up of the graphite sheet 40 and the organic EL panel 53 is covered with the film sheets 42. The sealing resin 84 is filled in every gap. As in the structure of the organic EL device 1, the spacer 46 is provided between the FPC 58 and the graphite sheet 40. The two organic EL panel modules 53 illustrated in FIG. 6 are driven independently of each other. Each of the two organic EL panel modules 53 is provided with the FPC 58.

Figure 7:
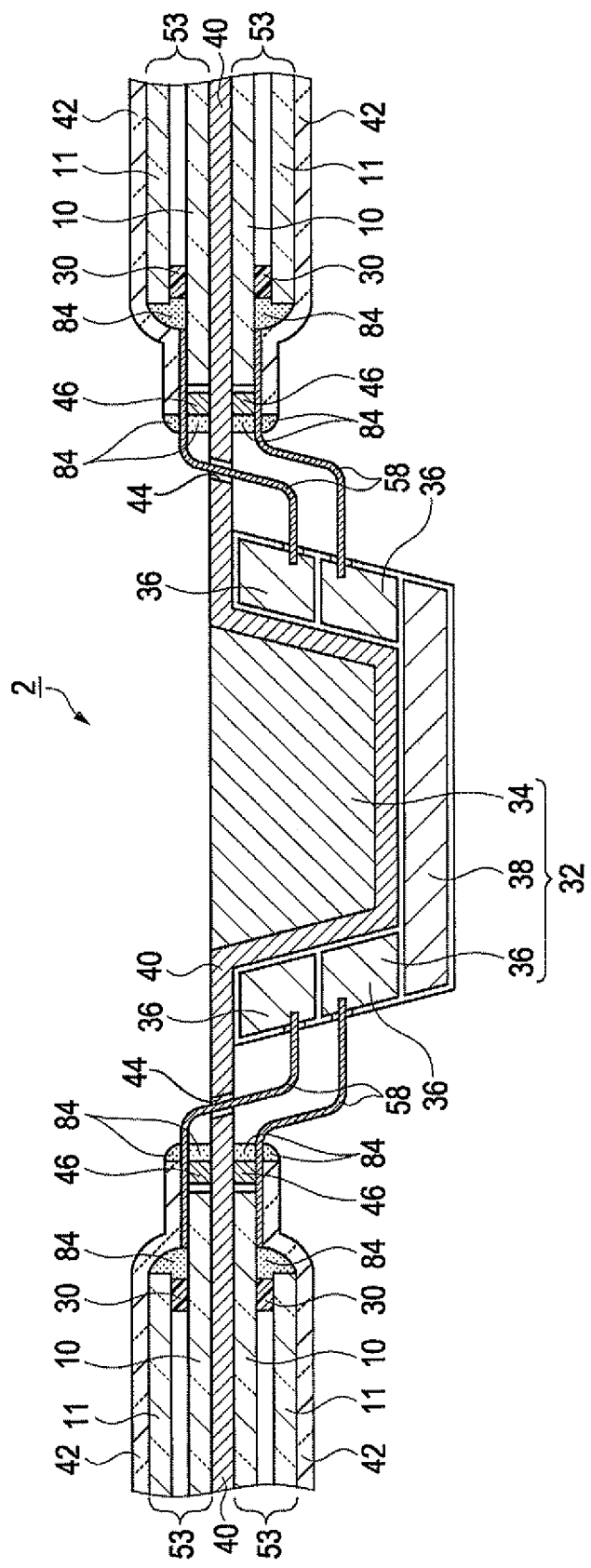
FIG. 7 is a sectional view that schematically illustrates an example of the structure of an organic EL device according to the second embodiment of the invention.

FIG. 7 is a sectional view that schematically illustrates an example of the structure of the organic EL device 2 taken along a plane perpendicular to the direction of the length of the supporting unit 32. FIG. 7 corresponds to FIG. 5. As in FIG. 5, organic EL panel modules 53 provided at both sides are partially shown in FIG. 7.

As illustrated therein, as the circuit unit 36, four circuit units are built in the supporting unit 32 of the organic EL device 2. The battery 38 has battery capacity that is large enough to supply driving power to four organic EL panel modules 53. At each of the two sides, the two organic EL panel modules 53 each of which is provided on the corresponding one of the two surfaces of the graphite sheet 40 are connected to the circuit unit 36 separately. At each of the two sides, the FPC 58 of the organic EL panel module 53 provided on the surface of the graphite sheet 40 on which the heat release bar 34 is provided is connected to the circuit unit 36 through the slit 44. In contrast, at each of the two sides, the FPC 58 of the organic EL panel module 53 provided on the surface of the graphite sheet 40 on which the circuit unit 36 is provided is connected to the circuit unit 36 without being inserted through the slit 44.

As explained above, in the structure of the organic EL device 2, the element-substrate (10) surface of one of the two organic EL panel modules 53 faces toward the element-substrate (10) surface of the other. Because of such a structure, when an image is displayed, heat generated due to the driving of the organic EL elements 29 might be transferred to the facing organic EL panel module 53. However, since the graphite sheet 40 is sandwiched between the two element substrates 10, most of the heat generated is transferred in the horizontal direction, that is, in the planar direction. Since the graphite sheet 40 has high thermal conductivity in the horizontal direction as explained earlier, most of the heat generated at one of the two organic EL panel modules 53 is transferred to the heat release bar 34 through the graphite sheet 40 and is then dissipated from the heat release bar 34. For this reason, it is possible to avoid the facing organic EL panel module 53 from being heated or suppress the heating thereof. Therefore, the organic EL device 2 can drive its two pairs of the organic EL panel modules 53 positioned opposite to each other, that is, the four organic EL panel modules 53 in total at the same time to display images or the like in a reliable manner. Each of the four organic EL panel modules 53 can be used as if it were a page of a book. Thus, a user can use the organic EL device 2 as a 4-page electronic book.

The scope of the invention is not limited to the exemplary embodiments described above. The invention may be modified, adapted, changed, or improved in a variety of modes in its actual implementation. Variation examples are explained below.

Variation Example 1

In the foregoing embodiments of the invention, an organic EL device that is provided with, as an electro-optical panel, the organic EL panel 53 that is provided with the plurality of organic EL elements 29 behaving as plural self-luminous elements is described. However, the invention may be applied to a mode in which self-luminous elements are not provided. For example, the invention can be applied to a structure in which a liquid crystal panel is used for display. A liquid crystal panel requires a backlight as its light source. Heat generated from the backlight can be transferred via the graphite sheet 40 to the heat release bar 34 and then dissipated from the heat release bar 34. With such heat release, it is possible to display an image or the like in a stable manner. The modified device can also be used as an electronic book. The organic EL panel 53 and another type of an electro-optical panel may be used in combination.

Variation Example 2

In the foregoing embodiments of the invention, the graphite sheet 40 is provided as a single sheet. However, the scope of the invention is not limited to such a structure. Two or more graphite sheets 40 may be provided. Though it is not preferable to form a plurality of graphite sheets 40 only in multiple layers because thermal conductivity decreases, it is possible to ensure good heat-releasing property by providing two or more heat release bars 34 and forming the heat release bars 34 and the graphite sheets 40 in alternate layers inside the supporting unit 32. By this means, it is possible to provide an electronic book with a larger number of pages.

The entire disclosure of Japanese Patent Application No. 2010-003685, filed Jan. 12, 2010 is expressly incorporated by reference herein.

What is claimed is:

1. An electro-optical device comprising:
a supporting unit that includes a first heat release member;
a second heat release member that has a first portion and a second portion, which is different from the first portion, the first portion of the second heat release member provided at one side with respect to the supporting unit,
the second portion of the second heat release member provided at the other side with respect to the supporting unit, and
at least a part of the second heat release member being in contact with the first heat release member;
a first electro-optical panel that is disposed on the first portion of the second heat release member; and
a second electro-optical panel that is disposed on the second portion of the second heat release member.

2. The electro-optical device according to claim 1, wherein the supporting unit further includes a circuit section for controlling at least one of the first and second electro-optical panels and a battery for driving at least one of the first and second electro-optical panels; and at least one of the first and second electro-optical panels are connected to the circuit section via an FPC.

3. The electro-optical device according to claim 1, wherein the second heat release member is a graphite sheet.

4. The electro-optical device according to claim 1, further comprising a first film sheet covering with a surface of the first electro-optical panel and a second film-sheet covering with a surface of the second electro-optical panel.

5. The electro-optical device according to claim 1, further comprising a third electro-optical panel, the second heat release member being disposed between the first electro-optical panel and the third electro-optical panel.

6. The electro-optical device according to claim 1, wherein the electro-optical panel hasan organic EL element.

* * * * *